U S008040652B2

(12) United States Patent
Forghani-zadeh et al.

(10) Patent No.: US 8,040,652 B2
(45) Date of Patent: Oct. 18, 2011

(54) PROGRAMMABLE POWER DISTRIBUTION SWITCHES WITH TWO-LEVEL CURRENT SENSING

(75) Inventors: H. Pooya Forghani-zadeh, Dallas, TX (US); Thomas A. Schmidt, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 317 days.

(21) Appl. No.: 12/198,353

(22) Filed: Aug. 26, 2008

(65) Prior Publication Data

US 2010/0052647 A1   Mar. 4, 2010

(51) Int. Cl.
*H02H 9/06* (2006.01)
*H02H 3/08* (2006.01)
*H02H 9/02* (2006.01)
(52) U.S. Cl. ..................................... 361/93.9; 361/93.1
(58) Field of Classification Search .................. 361/93.9
See application file for complete search history.

(56) References Cited

U.S. PATENT DOCUMENTS

| 5,375,029 | A | 12/1994 | Fukunaga et al. |
| 5,579,193 | A * | 11/1996 | Schmidt et al. ................. 361/18 |
| 5,747,975 | A | 5/1998 | Colandrea et al. |
| 6,127,882 | A | 10/2000 | Vargha et al. |
| 6,400,203 | B1 | 6/2002 | Bezzi et al. |
| 6,947,272 | B2 | 9/2005 | Daniels et al. |
| 6,954,108 | B2 | 10/2005 | Hastings et al. |
| 7,071,740 | B2 | 7/2006 | Adams et al. |
| 7,532,448 | B2 * | 5/2009 | So ................................ 361/93.9 |

* cited by examiner

*Primary Examiner* — Dharti Patel
(74) *Attorney, Agent, or Firm* — John J. Patti; Wade J. Brady, III; Frederick J. Telecky, Jr.

(57) ABSTRACT

Programmable power distribution switches with two-level current sensing are disclosed. In a particular example, a power distribution switch includes a programmable output device having a resistance based on a programmed maximum output current and generates an output voltage based on the resistance and a load current. The example power distribution switch also includes a reference voltage generator that is configured to generate a reference voltage corresponding to the output voltage when the load current is substantially equal to the programmed maximum output current. A current limiter is also included to reduce the load current in response to a comparison of the output voltage and the reference voltage, when the comparison is indicative of the load current exceeding the programmed maximum output current.

16 Claims, 6 Drawing Sheets

US 8,040,652 B2

PROGRAMMABLE POWER DISTRIBUTION SWITCHES WITH TWO-LEVEL CURRENT SENSING

FIELD OF THE DISCLOSURE

This disclosure relates generally to power distribution switches and, more particularly, to programmable power distribution switches with two-level current-sensing.

BACKGROUND

Power distribution switches are used to couple a power source to an output load device, and monitor and limit the power drawn by the output load device. Typical power distribution switches use current sensing to detect the current drawn by the output load device through the power distribution switch. In high-current applications, the resistance of the power distribution switch is very low, making the insertion of a resistor in the path of the current impractical due to power losses. In such applications, a small field effect transistor and a sense resistor are placed in parallel with the main power FETs of the power distribution switch to sense a small portion of the current. However, the sensitivity of this solution is low. As a result, current limits must be set very high to avoid improper shut down conditions, which poses a potential danger to the power distribution switch.

When adding current limit programmability, the sensitivity of prior solutions becomes even lower. Previous solutions implement current limit programmability by including an adjustable reference current to control the current limit. Because the sense resistor remains constant, the voltage drop over the resistor is reduced as the current limit is lowered programmatically, resulting in an increasing current sensing error due to circuit non-idealities such as transistor mismatches and offsets.

SUMMARY

Programmable power distribution switches with two-level current sensing are disclosed. In a particular example, a power distribution switch includes a programmable output device having a resistance based on a programmed maximum output current and generates an output voltage based on the resistance and a load current. The power distribution switch also includes a reference voltage generator that is configured to generate a reference voltage corresponding to the output voltage when the load current is substantially equal to the programmed maximum output current. A current limiter is also included to reduce the load current in response to a comparison of the output voltage and the reference voltage, when the comparison is indicative of the load current exceeding the programmed maximum output current.

DETAILED DESCRIPTION

Figure 1:
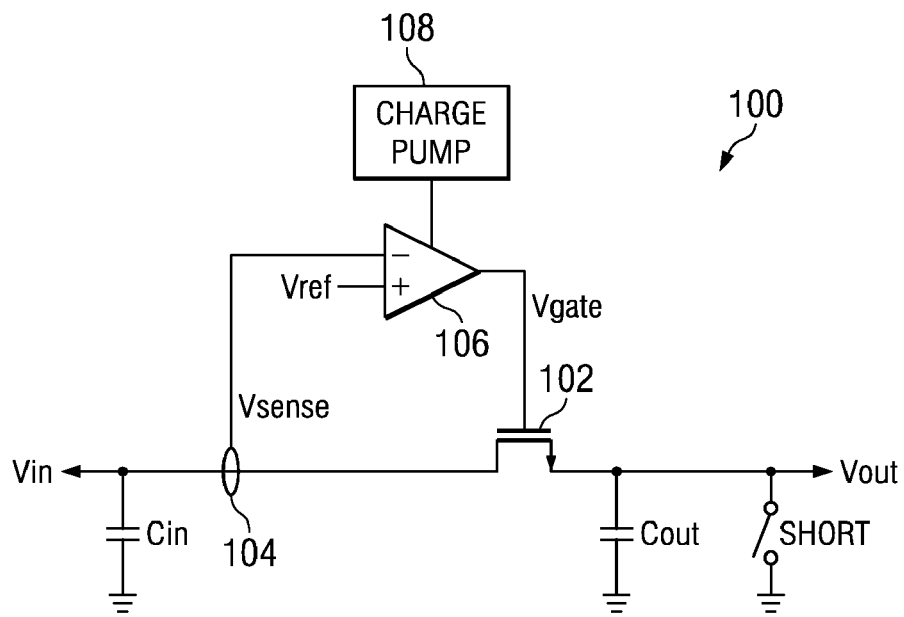
FIG. 1 is a block diagram of a known power distribution switch.

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example methods and apparatus, persons of ordinary skill in the art will readily appreciate that the examples are not the only way to implement such apparatus.

The example apparatus described herein may be used to provide power distribution switches with accurate and programmable current-sensing. In one particular example, a power distribution switch is described, which includes a two-level current-sensing scheme. A first level includes a fast limit that disables the circuit in case of a short-circuit at startup or during operation. A second level includes a slower, more accurate current-sensing technique that disables the circuit in response to slight over-currents for longer periods. The examples described herein allow current limits to be set closer to the maximum rated current for the power distribution switch relative to existing solutions. As a result, the power distribution switch is less likely to suffer damage resulting from prolonged overcurrent conditions.

The example power distribution switch also includes several n-type transistors to provide current paths from an input terminal of the power distribution switch to an output terminal, and an additional n-type transistor to provide a voltage reference associated with a current limit. The example power distribution switch further includes a current limit programmability feature that is implemented by selectively turning one or more of the conducting transistors on or off to increase or decrease the number of current paths in the power distribution switch. As the number of current paths decreases, the current limit of the power distribution switch decreases. In previous solutions, providing current programmability significantly degrades the current sensing sensitivity. However, the ability to turn off current paths allows the example power distribution switches described below to retain current sensing sensitivity through the entire range of current limits. The example power distribution switch has reduced sensitivity of programmability to circuit offsets by providing same level of processed input signal even at the lowest programmability level. As a result, the errors due to circuit non-idealities such as transistor mismatches and offsets remains the same.

FIG. 1 is a block diagram of a known power distribution switch 100. The power distribution switch 100 includes a power transistor 102 to control current flowing from an input terminal to an output terminal coupled to an output load device. The input terminal provides an input voltage (Vin) and for a low-resistance power transistor 102 the voltage (Vout) at the output terminal is approximately the same as Vin.

In the event of a short-circuit or general overcurrent condition at the output terminal, the power transistor 102 is configured to detect the condition and restrict current flowing from the input terminal to the output terminal. To this end, the power distribution switch 100 includes a sense resistor 104 to sense a small portion of the current flowing through the power transistor 102 and produce a sense voltage (Vsense) indicative of the current. An amplifier 106 compares Vsense to a reference voltage (Vref) that is generated to be representative of the power distribution switch current limit. Based on the comparison, the amplifier 106 generates a control voltage (Vgate) that determines the resistance of the power transistor 102. A charge pump 108 provides a supply voltage to the amplifier 106, which allows the amplifier to produce a voltage sufficient for the power transistor 102 to minimize the resistance from the input terminal to the output terminal when the power distribution switch 100 is operating normally. The power distribution switch 100 also includes an input capacitor Cin and an output capacitor Cout to filter the input and output voltages, respectively, as the output current fluctuates.

Upon detection of an overcurrent condition via the sense resistor 104, the amplifier 106 decreases Vgate, which increases the resistance of the power transistor 102. When the current decreases below the acceptable current level, the amplifier 106 increases Vgate to reduce the resistance of the power transistor 102, allowing more current to flow to the output terminal.

Figure 2:
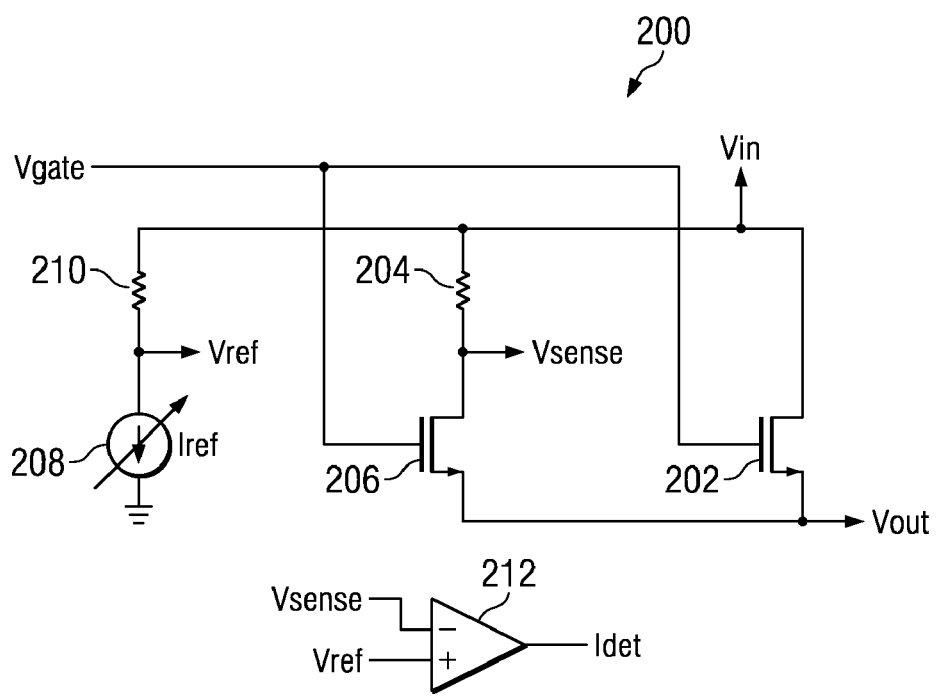
FIG. 2 is a schematic diagram of a known power distribution switch with a programmable current limit.

FIG. 2 is a schematic diagram of a known power distribution switch 200 with a programmable current limit. Similar to the power distribution switch 100 of FIG. 1, the power distribution switch 200 includes a power transistor 202 to control current flowing from an input terminal to an output terminal. To provide current detection, the power distribution switch 200 also includes a sense resistor 204 and a sense transistor 206 in parallel with the power transistor 202. The sense transistor 206 is controlled by the same gate voltage (Vgate) as the power transistor 202 and, thus, has a resistance that is proportional to the resistance of the power transistor 202. As a result, the resistor 204 generates a voltage drop to generate a sense voltage (Vsense) that is indicative of the current through the power transistor 202.

To generate a reference voltage, the power distribution switch 200 includes a programmable current generator 208 and a reference resistor 210. The current generator 208 draws a substantially constant current through the resistor 210, which generates a substantially constant reference voltage (Vref) for a given current. The current limit of the power distribution switch 200 may be programmed by a user by adjusting the current flowing through the current generator 208, which increases or decreases Vref accordingly. For example, to decrease the current limit a user decreases the current generator 208 current, which decreases the voltage drop over the resistor 210 and increases Vref.

The power distribution switch 200 further includes a comparator 212, which compares Vsense to Vref and outputs a signal (Idet) indicative of an overcurrent condition. Idet may be used to inform another circuit whether an overcurrent condition exists, or may be fed back to a control circuit to adjust Vgate. Because the comparator 212 is not an ideal comparator, there is an offset voltage associated with the comparison of Vsense to Vref. As the current limit is decreased via adjusting the current generator 208, the comparator offset becomes an increasingly large percentage of the difference in a comparison between Vsense and Vref. Thus, a programmable current limit for the power distribution switch 200 results in varying current sensing accuracy.

Figure 3:
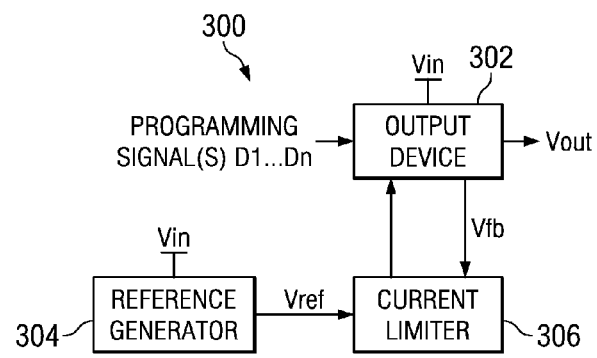
FIG. 3 is a block diagram of an example accurate programmable power distribution switch according to the described examples.

FIG. 3 is a block diagram of an example accurate programmable power distribution switch 300 according to the described examples. The example power distribution switch 300 may be used to provide a power distribution switch with current limit programmability without losing current detection accuracy. As mentioned above, previous power distribution circuits lose detection accuracy when introducing current limit programmability.

To maintain accuracy, the example power distribution switch 300 includes an output device or output circuit 302, a reference generator 304, and a current limiter 306. The output device 302 controls a current flowing from an input terminal to an output load (not shown) coupled to an output terminal. The reference generator 304 generates a reference voltage (or current) signal Vref that corresponds to a voltage (or current) when the output device 302 has reached a maximum programmed current level. The current limiter 306 compares the reference signal to a feedback voltage (or current) signal (Vfb) that is indicative of the current flowing through the output device 302. Thus, a reference voltage from the reference generator 304 remains constant and the feedback signal varies with the output device 302 current. If the current limiter 306 determines via the feedback voltage that the output device 302 current is higher than the programmed current limit, the current limiter 306 reduces the current flowing through the output device 302 (e.g., by increasing the resistance of the output device 302). The programmed current limit of the output device 302 may be controlled by applying one or more programming signals D1, Dn to the output device 302.

Figure 4:
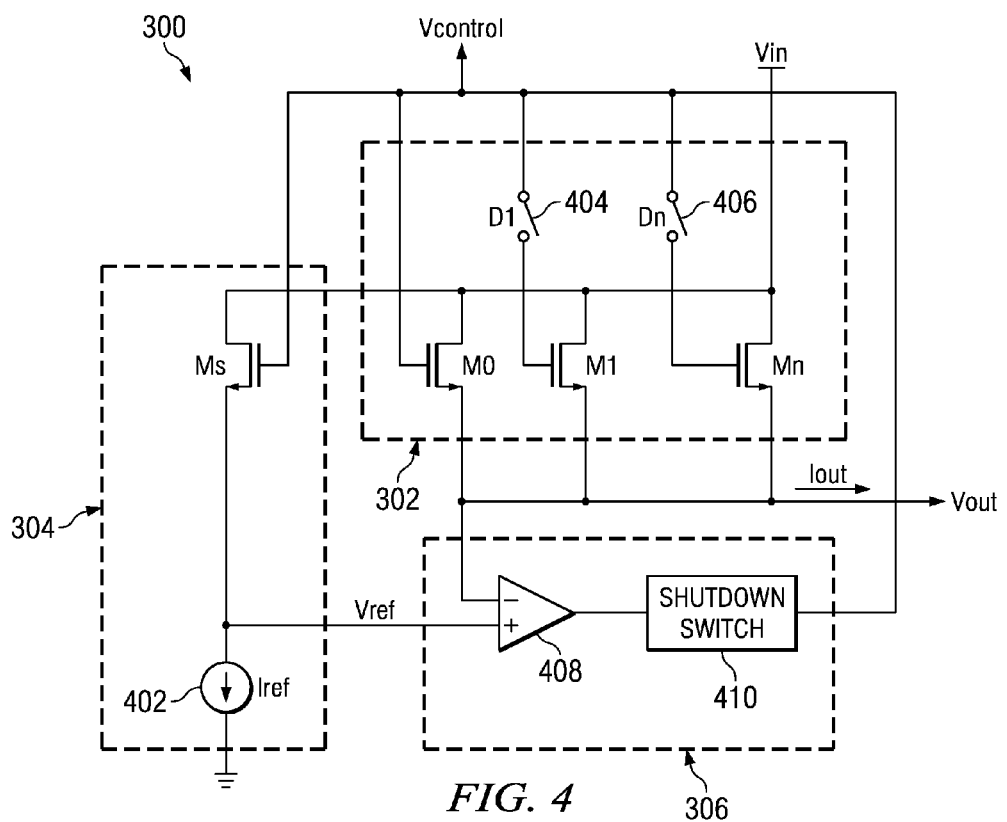
FIG. 4 is a more detailed schematic diagram of one implementation of the power distribution switch of FIG. 3, utilizing an accurate reference generator, according to the described examples.

FIG. 4 is a more detailed schematic diagram of one implementation of the power distribution switch 300 of FIG. 3, utilizing an accurate reference generator 304, according to the described examples. The example output device 302 includes multiple identical or substantially identical n-type field effect transistors (FETs) M0, M1, and Mn in parallel. The FETs M0, M1, and Mn conduct a current from an input power source having an input voltage (Vin) to an output terminal having an output voltage (Vout). The current flows from Vin to Vout via the drain-source terminals of the FETs M0, M1, Mn. Drain-source resistances of the FETs M0, M1, and Mn result in a net resistance between the Vin and Vout terminals (via parallel resistances). The net resistance is based on a control voltage (Vcontrol) applied to the gate terminals of the FETs M0, M1, and Mn, and decreases as Vcontrol increases. Because the example FETs M0, M1, and Mn are substantially identical, they each have substantially the same resistance and, thus, conduct substantially the same current at a given Vcontrol. The total current flowing through all of the FETs M0, M1, and Mn may be considered the total load current Iout.

The example reference generator 304 includes an n-type FET Ms and a current source 402, and generates an accurate reference voltage (Vref). The gate terminal of the FET Ms is coupled to Vcontrol, resulting in a voltage drop across the drain-source terminals of Ms that is proportional to the current flowing through the output device 302 while the FETs M0, M1, and/or Mn and the FET Ms are operating in ohmic (or linear) mode. If the FETs M0, M1, Mn, and/or Ms are operated in saturation mode (e.g., Vcontrol is at the charge pump voltage), the power distribution switch 300 relies on another current sensing/current limiting method. Example current sensing and/or current limiting methods include the fast reference generator or the analog limit function described below in FIG. 5.

While the FET Ms is operating in ohmic mode, the current source 402 draws a reference current (Iref) through the FET Ms. If the FET Ms is implemented to be identical or substantially identical to the FETs M0, M1, and Mn of the output device 302, the appropriate reference current Iref is dependent on the ratio of FETs in the output device 302 to reference FETs (e.g., Ms) and the maximum rated current as approximated by Equation 1:

$$Iref \approx \frac{I_{MAX}}{N} \quad \text{(Equation 1)}$$

where $I_{MAX}$ is the maximum rated current and N is the ratio of conducting FETs to reference FETs at the maximum programmed current. For example, if there are 10 FETs in parallel in the output device 102 (M0, M1, M2, . . . M9) and one reference FET (Ms), and the maximum rated current is 500 mA, Iref2 is set to be 50 mA. If the reference FET Ms is implemented differently than the FETs M0, M1, and Mn, the reference current Iref may be adjusted using other methods to achieve accurate current limits.

The applied Vcontrol at the gate terminal of the FET Ms causes a resistance between the drain-source terminals of the FET Ms and an accompanying voltage drop. Because Vcontrol is applied to the gate terminals of identical switching device FETs M0, M1, and Mn, the net resistance of the output device 302 is 1/(1+n) of the resistance of Ms, and the total current through the output device 302 is up to (1+n) times Iref (depending on the current draw of the output load(s)). As a result, while the total current through the output device 302 is less than Iref, the ohmic voltage drop (Vin-Vout) will be less than the ohmic voltage drop (Vin-Vref2).

The current limiter 306 is implemented using a comparator 408 to compare the reference voltage and a feedback voltage. In the example of FIG. 4, Vout is also used as the feedback voltage to the current limiter 306. As mentioned above, during normal operation Vout is at a higher voltage than Vref. However, when the load current Iout exceeds the programmed maximum current, Vout decreases below Vref and the comparator 408 generates a shutdown signal to a shutdown switch 410. In response to the shutdown signal, the example shutdown switch 410 pulls down Vcontrol to increase the resistance of the output device 302, thereby decreasing the load current Iout flowing through the output device 302. However, the shutdown switch 410 may be modified to decrease the load current Iout using other methods.

To implement current limit programmability, one or more FETs M1 and/or Mn (i.e., current paths) may be turned off or significantly increased in resistance to increase the total resistance of the output device 302. The example output device 302 includes the switching elements 404 and 406, which are controlled by programming signals D1 and Dn. The programming signals D1 and Dn may selectively decouple the gate terminals of respective transistors M1 and/or Mn, causing the transistors M1 and/or Mn to cut off or significantly reduce current flow therethrough. Cutting off transistors changes the ratio N described in Equation 1 while keeping Iref constant. For example, a first switching device with 10 current paths turned on has ½ of the net resistance and twice the current limit of a second switching device with 5 current paths turned on for a given Vcontrol and a given number of sense FETs. Thus, changing the total number of current paths for a given Vcontrol will result in substantially the same ohmic voltage drop (Vin-Vout) while reducing the current limit for the output device 302.

In contrast to the power distribution switch of FIG. 2, the example power distribution switch 300 of FIG. 4 does not lose accuracy when decreasing the programmed current limit of the output device 302. When turning off one or more transistors M1 and/or Mn, the overall resistance of the output device 302 increases such that the output voltage at the programmed maximum current is substantially the same despite the programmed current limit. Further, the reference current Iref does not change, so Vref is substantially constant. As a result, any errors that may be introduced to the current detection, such as comparator offset error, are minimized since the error is substantially the same for every programmed current limit.

Figure 5:
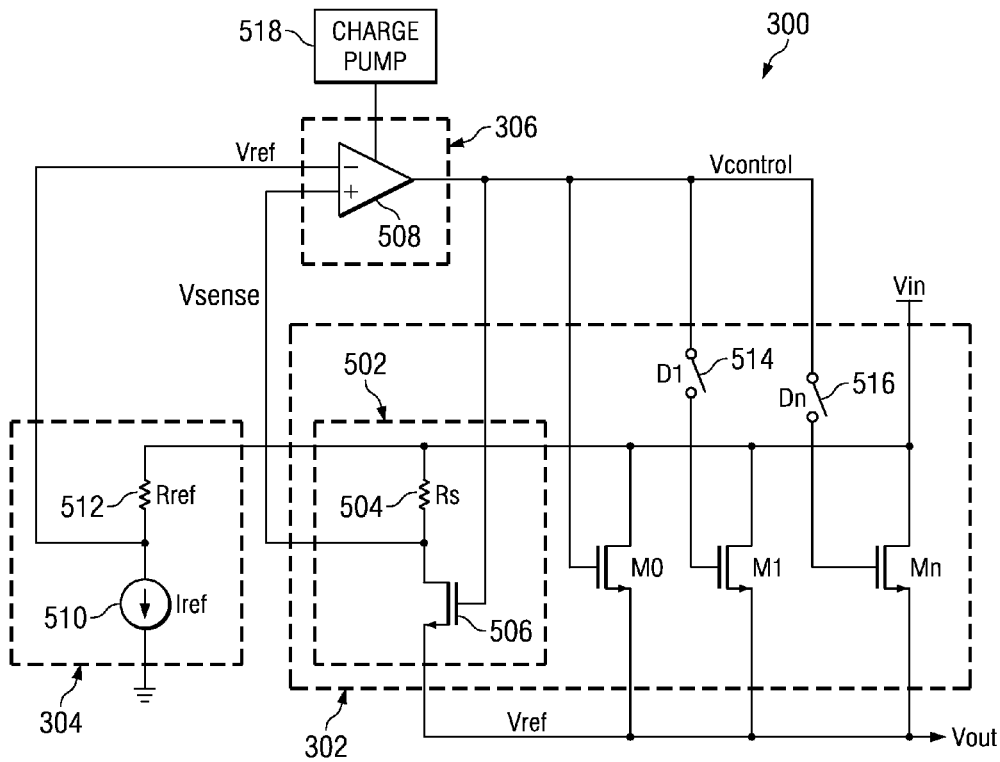
FIG. 5 is a more detailed schematic diagram of another implementation of the power distribution switch of FIG. 3, utilizing a fast reference generator, according to the described examples.

FIG. 5 is a more detailed schematic diagram of another implementation of the power distribution switch 300 of FIG. 3, utilizing a fast reference generator 304, according to the described examples. The example output device 302 shown in FIG. 5 is similar to the example output device 302 shown in FIG. 4, as well as a sense voltage generator 502 implemented using a sense resistor 504 and a sense transistor 506. The sense voltage generator 502 senses a fraction of the current flowing through the output device 302, and generates a sense voltage Vsense. The reference voltage generator 304 is implemented using a fast reference generator to generate a reference voltage indicative of a current limit. The current limiter 306 includes an amplifier 508 to adjust the control voltage Vcontrol in response to a comparison of Vref and Vsense. For example, the amplifier 508 may lower Vcontrol in response to detecting that Vsense has dropped below Vref, which increases the resistance of the output device 302.

Similar to the example implementation shown in FIG. 4, adjusting the programmed current limit via programming signals D1 and/or Dn does not substantially affect the accuracy of the reference voltage generator 304 or the sense voltage generator 502. The output device 302 resistance change described above with regard to lowering the current limit causes a proportionally larger current to flow through the sense transistor 506 and sense resistor 504. The increased current through the resistor 504 lowers the current at which Vsense drops below Vref. Further, the current source 510 of the reference voltage generator 304 remains constant, producing a constant voltage drop across the resistor 512 and a constant Vref. As a result, the programmability of the output device 302 maximum current limit does not affect the accuracy of current limiting.

The amplifier 508 generates the control voltage Vcontrol to the gate terminals of FETs M0, M1, and/or Mn that are coupled to Vcontrol directly and by switches 514 and/or 516. The amplifier 508 has a positive supply voltage generated by a charge pump 518 to be greater than Vin, and generates Vcontrol up to the supply voltage based on comparison of a reference voltage Vref1 and a sense voltage Vsense.

Vref is generated by the reference generator 304. The example reference generator implementation of FIG. 5 is significantly faster than the example implementation of the reference generator of FIG. 4. An example fast reference generator 106 includes a current source 208 and a resistor 210. The current source 208 generates Vref by pulling a current (Iref) through the resistor 210, inducing a voltage drop from Vin based on the resistance value (Rref) of the resistor 210. Because the current Iref is constant, Vref does not typically change during operation of the circuit.

Vsense is generated by the sense block 502 in parallel with the FETs M0, M1, and Mn. The example fast sense block 502 includes a sense FET 506 and a sense resistor 504. The sense voltage Vsense is indicative of the current flowing through the output device 302, and is generated by the fast sense block 502 as described below. The gate terminal of FET 506 is coupled to Vcontrol, so the current drawn through the FET 506 is proportional to the current in the output device 302. The resistance Rs of the example resistor 504 is approximately 10-20% of the resistance of the FET 506. As the current is pulled through the resistor 504, Vsense is generated from the voltage drop over the resistor 504. The reference and sense voltages may be equalized by proper selection or design of the resistors 504 and 512 and the FET 506 so that Vsense is equal to Vref when the current Iout through the output device 302 is equal to the desired current limit.

While the current flowing through the output device 302 is less than the current limit, the amplifier 508 generates Vcontrol substantially at the supply voltage provided by the charge pump 518, causing the net resistance of the output device 302 to be as low as possible for a given programmed current limit. The current limit may be approximated by Equation 2:

$$I_{LIM} = NI_{ref1} \frac{R_{ref}}{R_{SENSE}} \qquad \text{(Equation 2)}$$

where N is the ratio of conducting switching device FETs (e.g., M0, M1, Mn) to sense FETs (e.g., n-type FET Ms), and Rsense is the resistance of a sense resistor 504. As the current increases above the current limit, Vsense decreases below Vref, causing the amplifier 508 to decrease Vcontrol. This results in an increased output device 302 resistance and a lower current Iout flowing from Vin to Vout.

The current limiter 306 described in FIGS. 3-5 is shown using simple current limiter devices. However, it is noted that alternative implementations may be used to reduce current through an output device, such as notifying a processing device of an overcurrent condition, which then instructs an output load device coupled to the output device 302 to self-regulate current. Other implementations or methods to reduce current are also possible, and fall within the scope of the invention. Further, in some applications, the current limiter may generate a warning signal to indicate to one or more other devices that the output device is drawing current above the current limit. For example, a power distribution switch may signal to a power allocation device that an output load device is drawing excess current, to which the power allocation device responds by reducing allocated power for another output load device.

Figure 6:
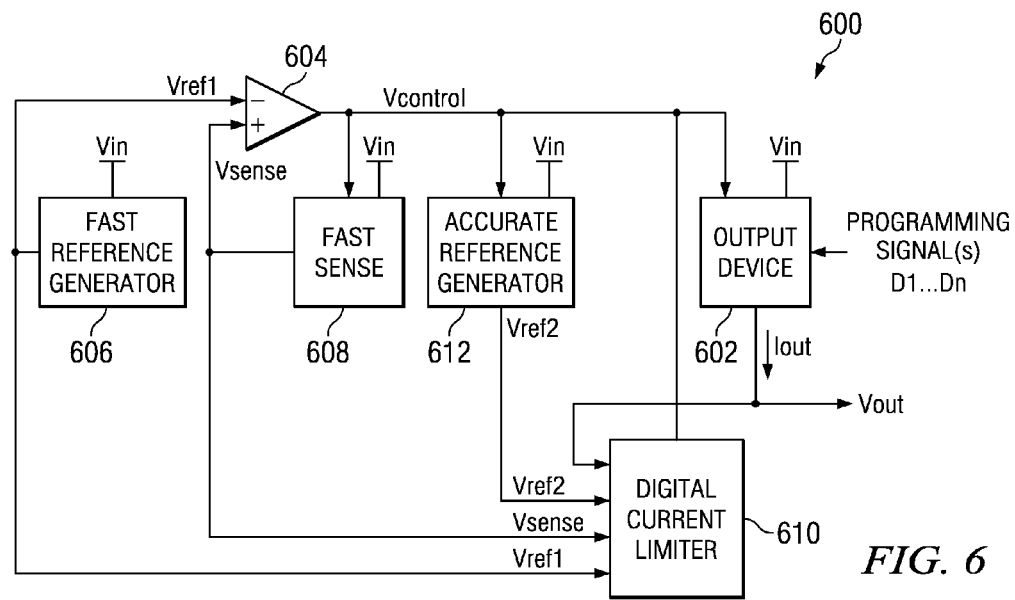
FIG. 6 is a block diagram of an example power distribution switch utilizing two-level current sensing according to the described examples.

FIG. 6 is a block diagram of an example power distribution switch 600 utilizing two-level current sensing according to the described examples. The power distribution switch 600 includes an output device 602, which couples an input power source having an input voltage (Vin) to one or more output devices (not shown) at an output voltage (Vout). In the example of FIG. 6, Vout is approximately the same voltage as Vin due to a low coupling resistance at the output device 602. The output device 602 conducts a load or output current (Iout) from Vin to Vout and limits the load current Iout if the load current Iout exceeds a predetermined current limit.

The example output device 602 couples Vin to Vout via a coupling resistance. Lower coupling resistances permit a higher current to flow through the output device 602 (i.e., provide a higher current limit). As described below, the current limit may be programmable by adjusting the coupling resistance of the output device 602 via, for example, digital programming signals D1 to Dn. In an example implementation, the programming signals control corresponding current paths within the output device 602 to adjust the programmed maximum current limit.

The example power distribution switch 600 further includes an analog limit function implemented using an amplifier 604. The amplifier 604 outputs a control signal (Vcontrol) to the output device 602 from a comparison of a reference signal (Vref1) and a current sense signal (Vsense). A fast reference generator 606 generates Vref1 to be a constant signal indicative of a current limit. A fast sense block 608 generates Vsense to be indicative of the current flowing through the output device 602. While Vsense is a higher voltage than Vref1, the amplifier 604 outputs a positive or high control voltage that minimizes the resistance of the output device 602 to allow current to flow through the output device 602. However, if the current Iout through the output device 602 exceeds the current limit set by the fast reference generator 606, Vsense will decrease below Vref1, and the amplifier 604 will modify Vcontrol to increase the resistance of the output device 602. The increased resistance reduces the current Iout flowing through the output device 602 from Vin to Vout.

In addition to the analog limit function, the power distribution circuit 600 includes a digital current limiter 610 to disable Vcontrol in response to certain overcurrent conditions so that, collectively, amplifier 604 and digital current limiter 610 can operate as a current limiter. The example digital current limiter 610 includes dual current limit detection to detect two different overcurrent conditions. The first overcurrent condition, such as a hard short-circuit, is detected by the digital current limiter via the Vref1 and Vsense signals from the fast reference generator 606 and the fast sense block 608, respectively. The digital current limiter 610 detects a hard short-circuit very rapidly and disables Vcontrol to prevent damage to the circuit resulting from very large currents. Disabling Vcontrol causes the output device 602 to cut off or significantly limit the load current Tout flowing from Vin to Vout. For example, if the power distribution switch 600 has a maximum rated current of 500 milliamperes (mA), the digital current limiter 610 may disable Vcontrol quickly in response to detecting a condition on Vsense and Vref1 that is indicative of a 1 Ampere (A) load current Tout through the output device 602.

The second overcurrent condition, such as a slight, yet prolonged overcurrent, is also detected by the digital current limiter 610. An accurate reference generator 612 generates a sense voltage Vref2 that is indicative of a programmed maximum output current. The voltages Vref2 and Vout are used by the digital current limiter 610 to detect an overcurrent condition, which causes the digital current limiter 610 to disable Vcontrol.

The accurate reference generator 612 generates a voltage at an increased accuracy relative to the fast reference generator 606. The increased sensitivity is the result of a larger voltage sensing range available to the accurate reference generator 612. The accurate reference generator 612 generates an accurate reference voltage indicative of the programmed maximum output current (Vref2), which is used by the digital current limiter 608 to determine an overcurrent condition. The accurate reference voltage may be substantially equal to the expected output voltage Vout when the load current is equal to the programmed maximum output current. Because Vout at the programmed maximum current is independent of the programmed maximum current, the reference voltage Vref2 is constant or substantially constant. The higher voltage range prevents comparator error from degrading accuracy or sensitivity when using a comparator to detect overcurrent from Vout and Vref2.

The accurate reference generator 612 may be used to provide a current limit that is close to the maximum rated current of the power distribution switch 600. For example, in an existing power distribution switch with a 500 mA rated maximum current, the current limit may be set to 1 A to reduce the chances of improper current limiting (e.g., shutting down the circuit in response to transients). In contrast, the example power distribution switch 600 may have the current limit set to 600 mA for a 500 mA rated maximum current. As a result, the example power distribution switch 600 is less likely to suffer problems associated with overcurrent conditions, while avoiding improper current limiting.

During normal operation (i.e., when Iout is less than the current limit), the amplifier 604 sets Vcontrol to minimize the output device 602 resistance, and the digital current limiter 610 does not affect Vcontrol. However, if an output load device coupled to the output terminal suffers a short-circuit or a prolonged overcurrent condition, the digital current limiter 110 detects the condition via Vref1 and Vsense, or via Vref2 and Vout, and disables Vcontrol to remove the condition. The amplifier 104 may handle some overcurrent conditions by adjusting Vcontrol slowly to increase the resistance of the output device 102, thus reducing the current Iout.

Figure 7:
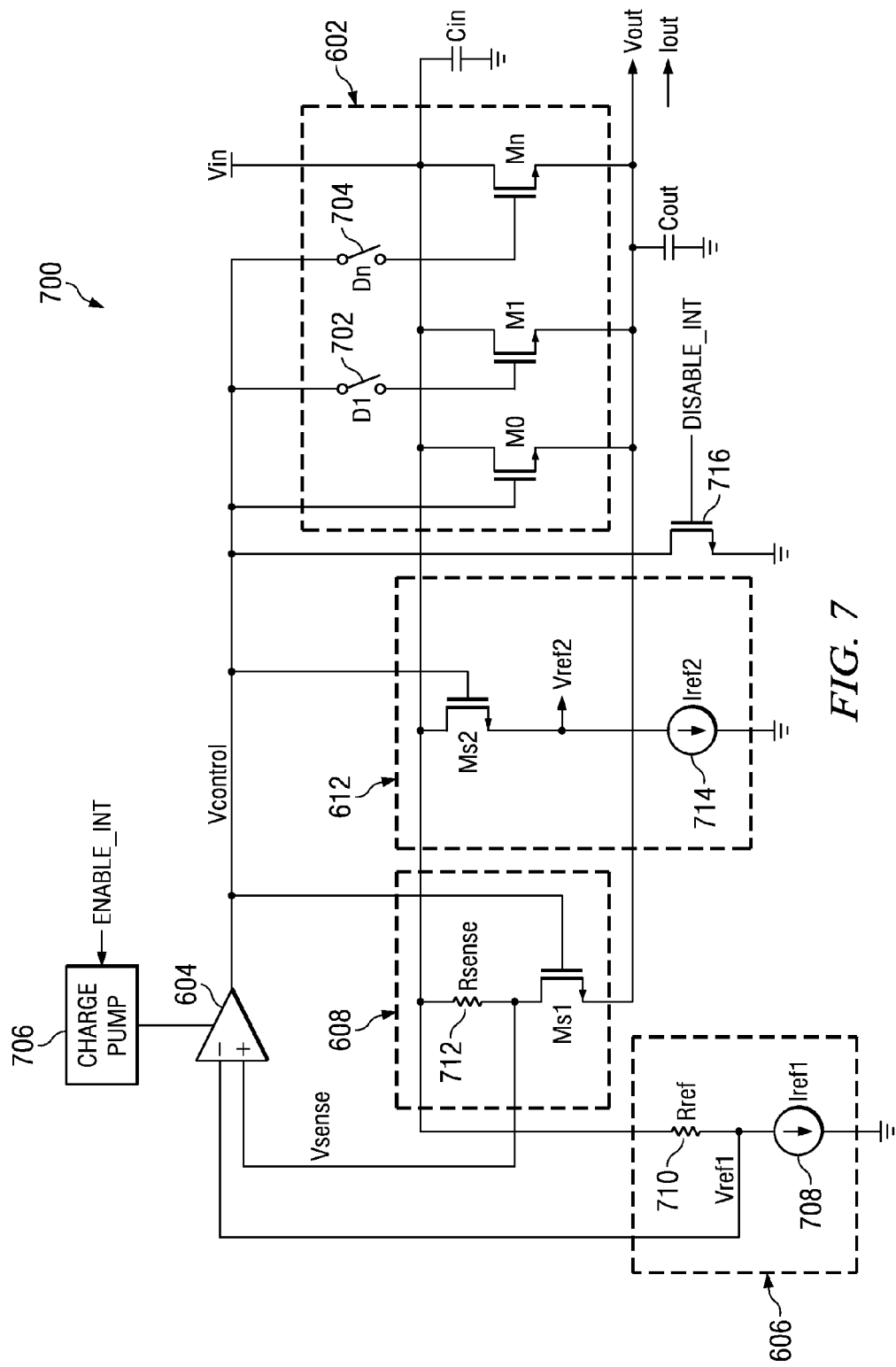
FIG. 7 is a more detailed block diagram of the example power distribution switch of FIG. 6 according to the described examples.

FIG. 7 is a more detailed block diagram of the example power distribution switch 600 shown in FIG. 6 according to the described examples. The example power distribution switch 700 includes the output device 602, the amplifier 604, the reference generators 606 and 612, and the sensing block 608 of FIG. 6. An example digital current limiter 610 is described in FIG. 8 and may be used in combination with the power distribution switch 700 to implement the power distribution switch 600 of FIG. 6.

The output device 602 further includes switches 702 and 704 to couple or decouple the gate terminals of FETs M1 and Mn to Vcontrol. Decoupling the gate terminal(s) of a FET M1 and/or Mn from Vcontrol significantly increases the drain-source resistance of the FET, and may turn off the FET completely. For each FET M1, Mn that is turned off or increased in resistance, the net resistance from Vin to Vout is increased, decreasing the maximum total current Iout that may flow through the output device 602. The switches 702 and 704 are controlled by digital inputs D1 and Dn, respectively (i.e., programming signals). By selecting a certain number of digital inputs to couple corresponding FET gate terminals to Vcontrol, a user may program a desired current limit. The gate of FET M0 is directly coupled to Vcontrol so the output device 602 provides at least one current path from Vin to Vout.

The example power distribution switch 700 does not include a switching element to couple and decouple the gate terminal of the FET M0 to Vcontrol. However, it is noted that a switching element may be provided for this purpose to implement another current limit function via programming signals D0, D1, and Dn. It is further noted that the FETs M0, M1, and Mn may be implemented to conduct different currents to achieve different current limit programming schemes.

Figure 8:
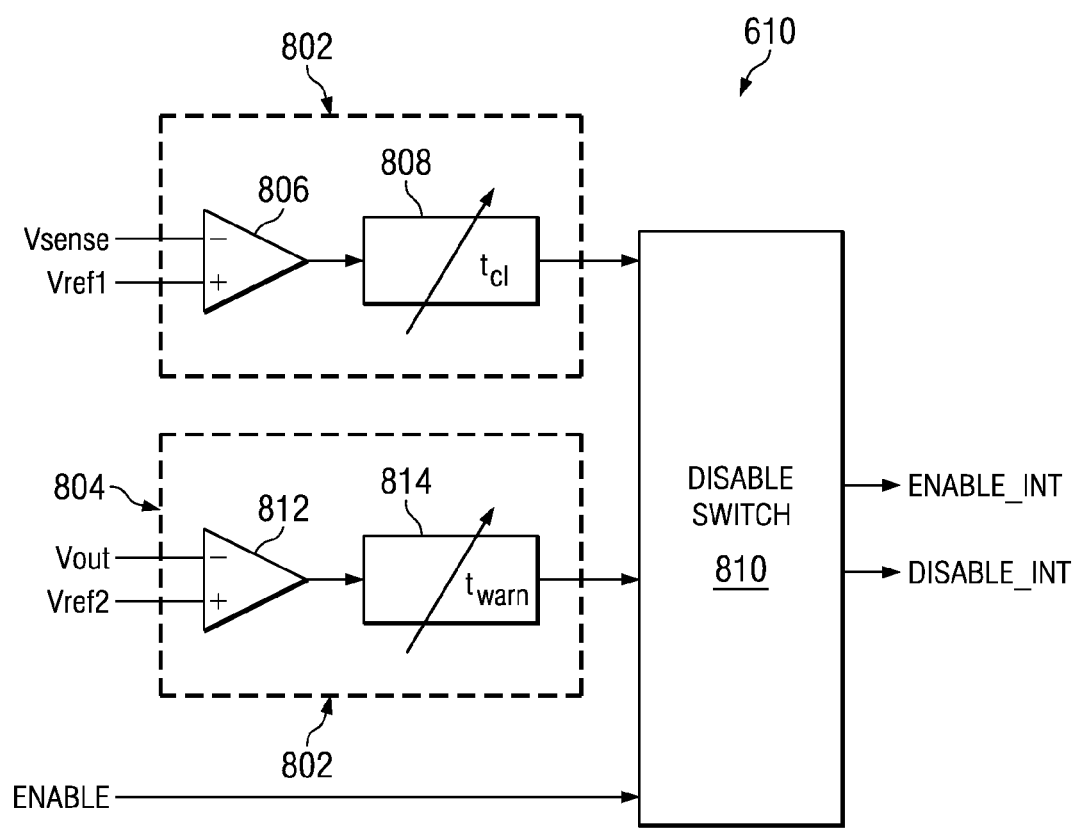
FIG. 8 is a more detailed block diagram of the digital current limiter of FIG. 6 according to the described examples.

FIG. 8 is a more detailed block diagram of an example digital current limiter 800 according to the described examples. The example digital current limiter 800 may be used to implement the digital current limiter 610 described in connection with FIG. 6. Used in combination with the example power distribution switch 700 of FIG. 7, the digital current limiter 800 may be used to implement the power distribution switch 600 of FIG. 6. The example reference voltage, sense voltage, and output voltage generated in the power distribution switch 700 of FIG. 7 are used in the digital current limiter 800 to generate ENABLE_INT and DISABLE_INT signals, which are used to enable and/or disable power distribution switch 700 in response to the presence of an overcurrent condition.

The digital current limiter 800 includes a fast current limiter 802 to limit current in response to Vref1 and Vsense, and a slow current limiter 804 to limit current in response to Vref2 and Vout. The fast current limiter 802 includes a comparator 806 and a programmable timing device or timing circuit 808. The comparator 806 compares Vsense and Vref1 and outputs a shutdown signal to the timing device 808. As described above, while the current flowing through the output device 602 is less than the fast current sensing current limit (e.g., 1 A current limit for a 500 mA maximum current rating), Vsense is at a higher voltage than Vref1, and the comparator outputs a logic low (i.e., logic 0) signal. However, as the current increases above the fast current sensing current limit, Vsense decreases below Vref1 and the comparator outputs a logic high shutdown signal. The logic high shutdown signal starts a countdown at the timing device 808 from a delay time tCL. When the timer reaches zero, the timing device 808 passes the shutdown signal to a disable switch 810. Upon receiving the shutdown signal, the disable switch 810 causes the power distribution switch to limit the current in the output device 602 as described below. However, if the comparator 806 outputs a logic low shutdown signal prior to the timing device 808 reaching a zero count, the timing device 808 will reset and will not pass the shutdown signal to the disable switch 810.

The slow current limiter 804 includes a comparator 812 and a timing device or timing circuit 814. The comparator 812 compares Vout to Vref2 (i.e., compares the current through the output device 602 with Iref2) and outputs a shutdown signal to the timing device 814. As described above, while the current flowing through the output device 602 is less than the accurate current sensing current limit, Vout is at a higher voltage than Vref2 due to the voltage drop at the FET Ms2, causing the shutdown signal from the comparator 812 to be at a logic low. However, as the current flowing through the output device 602 increases above the accurate current sensing current limit, a greater voltage drop occurs at the output device 602 from Vin to Vout than occurs at the FET Ms2 from Vin to Vref2. Thus, Vout drops to a lower voltage than Vref2, triggering the comparator to output a logic high shutdown signal to the timing device 814. On receiving the logic high shutdown signal from the comparator 812, the timing device 814 starts counting down from a delay time tWARN. If the timing device 814 counts down to zero while the shutdown signal remains at logic high, the timing device 814 passes the shutdown signal to the disable switch 810, causing the disable switch 810 to limit the output device 602 current. If the shutdown signal from the comparator 812 goes to logic low (e.g., the overcurrent condition no longer exists) prior to the timing device 814 counting to zero, the timing device 814 resets and does not pass the shutdown signal to the disable switch 810.

The example disable switch 810 outputs two signals (ENABLE_INT and DISABLE_INT) to selectively limit the current through the power distribution switch 700 in case of an overcurrent condition. During normal operation, the ENABLE_INT signal is at logic high, and the DISABLE_INT signal is at logic low. In response to a shutdown signal from either timing device 808 or 814, however, the ENABLE_INT and DISABLE_INT signals change logical states to logic low and logic high, respectively.

Returning to FIG. 7, the ENABLE_INT signal from the disable switch 810 controls the operational state of the charge pump 706. When ENABLE_INT is at logic high (i.e., during normal operation), the charge pump 706 is operational and generates the supply voltage for the amplifier 604. In contrast, when the disable switch 810 causes the ENABLE_INT signal to go to logic low in response to a current limit event, the charge pump 706 is shut down and the supply voltage may drop to a reference voltage (e.g., ground, 0 V), causing Vcontrol to drop.

The DISABLE_INT signal generated by the disable switch 810 controls the gate terminal of an n-type shutdown FET 716. The example shutdown FET 716 couples the gate terminals (i.e., the control voltage Vcontrol) of the FETs M0, M1, Mn, Ms1, and Ms2 to the ground reference to increase the resistance of the FETs and decrease the current Iout flowing through the output device 602. During normal operation, the DISABLE_INT signal is low, causing the shutdown FET 716 to cut off. When the disable switch 810 receives a shutdown signal, DISABLE_INT is set to logic high and turns on the shutdown FET 716, causing Vcontrol to be pulled down to the ground reference. The reduced Vcontrol increases the resistance of the output device 602 and reduces the current Iout flowing from Vin to Vout.

The disable switch 810 may further receive a general enable signal (Enable) to control the operation of the power distribution switch 700 from an external signal or circuit. For example, the signal may be sent to the disable switch 810 from an external controller via a serial peripheral interface (SPI) bus. When the Enable signal is asserted (e.g., logic high), the power distribution switch 700 and the digital current limiter 800 may operate normally. However, when the Enable signal is deasserted (e.g., logic low), the ENABLE_INT signal goes to logic low, disabling the charge pump 706. Because the charge pump 706 is disabled, the amplifier 604 does not receive a sufficient supply voltage to output a Vcontrol signal that can turn on the output device 602. Thus, the Enable signal may be used to control the operation of the power distribution switch 700. Alternatively, the Enable signal may be omitted. It is noted that the disable switch 810 may be configured to use digital or analog Enable signals.

The power distribution switch 700 includes input and output capacitors Cin and Cout, respectively. The capacitors Cin and Cout filter the input and output voltages Vin and Vout, provide charge buffers for high-capacitance loads, and/or prevent sudden voltage drops at the input and/or output terminals. Although the example capacitors Cin and Cout are shown as individual capacitors, it should be apparent that either or both capacitors may be implemented using multiple capacitors and/or other capacitive elements.

The delay times $t_{CL}$ and/or $t_{WARN}$ may be programmed by a user to increase or decrease either or both delay times. A larger delay time allows more time before the power distribution switch 700 is current limited by the digital current limiter 800 in case of a transient event. However, the larger delay time also increases the risk of undesirable effects. In contrast, a shorter delay time may result in an undesirable shutdown of the power distribution switch 700 in response to a harmless transient event.

The digital programming signals D1 and Dn, the programmable delay devices 808 and 814, and the Enable signal of FIGS. 7 and 8 may be implemented using any type of serial or parallel communication. One particular example may be an SPI bus. Further, the signals may come from any source or combination of sources. For example, the digital programming signals D1 and Dn and/or the times $t_{CL}$ and $t_{WARN}$ may be provided by an electrically erasable/programmable read-only memory (EEPROM) on initial startup of the power distribution switch 700. The Enable signal may be a continuous digital signal from a logic controller to enable or disable the power distribution switch 700 in response to hardware, software, and/or firmware commands.

The disable switch 810 may be implemented using, for example, a state machine to generate the ENABLE_INT and DISABLE_INT signals based on shutdown signal indications from the current limiters 802 and/or 804.

Figure 9:
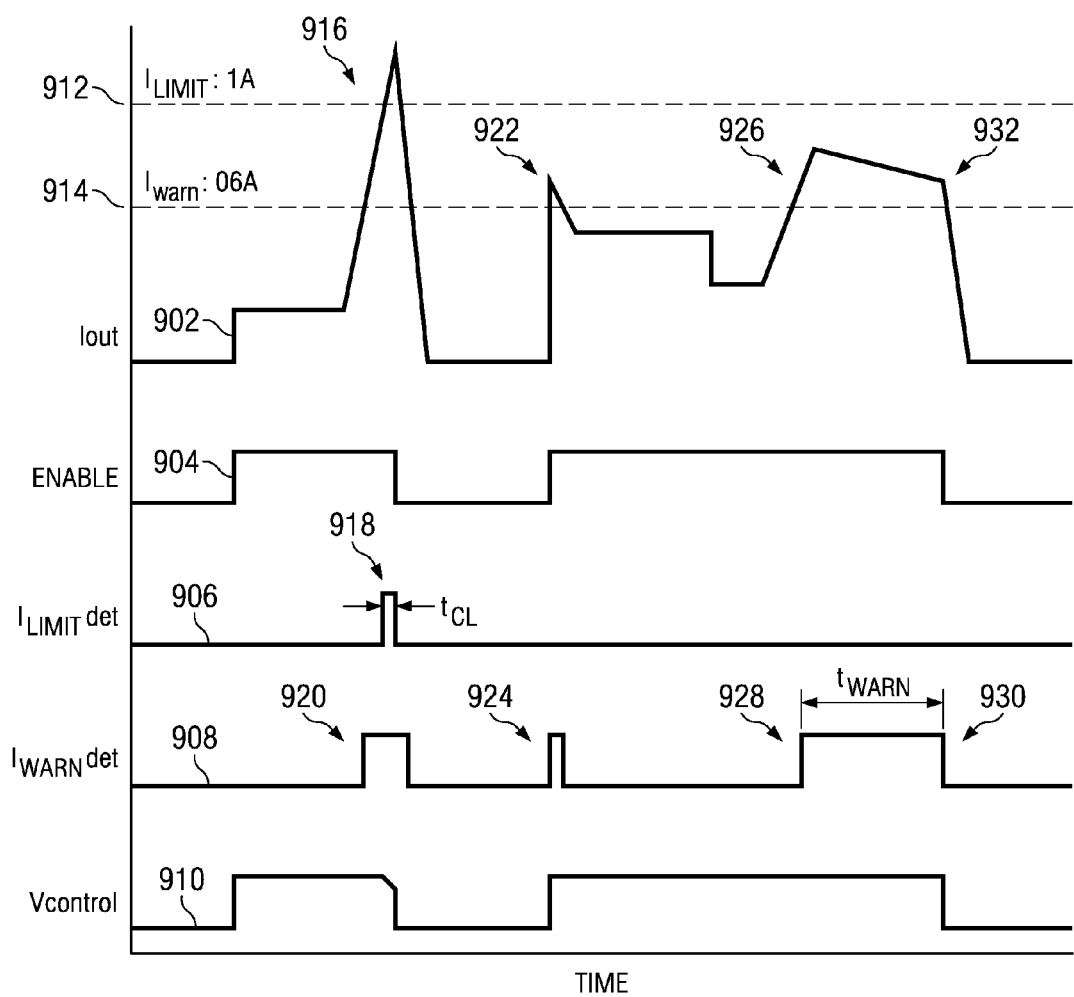
FIG. 9 is a diagram illustrating example power distribution switch currents and signals.

FIG. 9 is a diagram illustrating example current and signal relationships for the power distribution switch 700 of FIGS. 7 and 8. The diagram includes the output device 902 current 902 (Iout), a circuit enable signal 904 (Enable), a fast current limiter signal 906 ($I_{LIMIT}$det), a slow current limiter signal 908 ($I_{WARN}$det), and the Vcontrol signal 910. $I_{LIMIT}$det 906 is the output of the comparator 806, and $I_{WARN}$det 908 is the output of the comparator 808 of FIG. 8. For the example of FIG. 9, a fast current limit 912 ($I_{LIMIT}$) is set at 1 A, and a slow current limit 914 ($I_{WARN}$) is set at 600 mA. When Iout 902 is greater than $I_{WARN}$ 912, $I_{WARN}$det 908 is set to logic high, and when Iout 902 is greater than $I_{LIMIT}$ 910, $I_{LIMIT}$det 906 is set to logic high as described above in connection with FIG. 8.

The example Iout 902 first increases to the current limit $I_{LIMIT}$ 910 at time 916. The comparator 806 detects the increase via Vsense and Vref1, and increases $I_{LIMIT}$det 906 to logic high, starting the timing device 808 counting from $t_{CL}$. After the time $t_{CL}$ has lapsed, the timing device 808 sends the shutdown signal to the disable switch 810, causing the power distribution switch 700 to cut off the Iout 902 current at time 918. When Iout 902 increases over $I_{LIMIT}$ 912, Iout must also increase over $I_{WARN}$ 914, causing $I_{WARN}$det 908 to trigger for a pulse 920. However, $I_{WARN}$det 908 is not asserted for $t_{WARN}$ before $I_{LIMIT}$det 906 shuts down the power distribution switch 700 and, thus, has no effect on the disable switch 810. While the current Iout 902 is over $I_{LIMIT}$ 912, Vcontrol 910 is decreased via the amplifier 904 but is disabled prior to significantly increasing the resistance of the output device 902.

When the Enable signal 904 re-enables Vcontrol via the disable switch 810, the output device 902 begins to conduct current and Iout 902 increases. At a time 922, Iout 902 increases above $I_{WARN}$ 914 but remains below $I_{LIMIT}$ 912 (e.g., due to a transient event). As a result, the comparator 812 detects the overcurrent condition via Vout and Vref2, increases $I_{WARN}$det 908 to logic high at 924, and starts the timing device 814. However, before the timing device 814 counts from $I_{WARN}$ to zero, the current Iout 902 decreases below $I_{WARN}$ 912, causing the comparator 812 to set $I_{WARN}$det 908 to logic low. This prevents a shutdown signal from reaching the disable switch 810 and shutting down the power distribution switch 700 in response to a harmless transient event.

At yet another time 926, the Iout 902 current increases above $I_{WARN}$ 912, causing $I_{WARN}$det 908 to increase to logic high at 928. The timing device 814 counts from $I_{WARN}$ to zero while Iout 902 remains above $I_{WARN}$ 912. When the timing device 814 reaches zero at 930, the shutdown signal is sent to the disable switch 810, which shuts down the power distribution switch 700 and cuts off Iout 902 at time 932.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A power distribution switch comprising:
   a programmable output circuit having a resistance based on a programmed maximum output current, wherein the programmable output circuit generates an output voltage based on the resistance and a load current;
   a reference voltage generator that generates a reference voltage that corresponds to a feedback voltage when the load current is substantially equal to the programmed maximum output current; and
   a current limiter having an amplifier that receives the reference voltage and a sense voltage and that generates a control voltage, wherein the sense voltage corresponds to at least a portion of a current flowing through the programmable output circuit, and wherein the control voltage is applied to the programmable output circuit.

2. The power distribution switch of claim 1, wherein the reference voltage generator comprises a reference current source and a switching device.

3. The power distribution switch of claim 1, wherein the output circuit comprises a plurality of parallel current paths that each current path having a path resistance.

4. The power distribution switch of claim 3, wherein the programmed maximum output current is programmed by modifying the path resistance of at least one current path.

5. The power distribution switch of claim 4, wherein the path resistances are each based on a corresponding digital programming signal.

6. The power distribution switch of claim 1, wherein the current limiter further comprises a digital current limiter having:
   a comparator that provide a shutdown signal based on the output voltage and the reference voltage; and
   a disable switch reduces the load current in response to the shutdown signal.

7. The power distribution switch of claim 1, wherein the output voltage corresponding to the load current is not substantially changed by changing the programmed maximum current limit.

8. The power distribution switch of claim 1, wherein the feedback voltage comprises the output voltage.

9. A power distribution switch comprising:
   an amplifier that generates a control voltage;
   a first power FET that provides a first resistance from an input terminal having an input voltage to an output terminal having an output voltage, wherein the resistance is based on the control voltage;
   a second power FET that selectively provides a second resistance from the input terminal to the output terminal based on a user-programmable digital signal, wherein the second resistance is based on the control voltage and the digital signal selectively couples a gate terminal of the second power FET to the control voltage;
   a reference resistor that generates a first reference voltage based on a first constant reference current, a first voltage drop based on the first reference current, and the input voltage;
   a first sense FET that generates a second reference voltage based on a second reference current, a second voltage drop based on the control voltage and the second reference current, and the input voltage;
   a second sense FET that generates a sense voltage indicative of a load current flowing through the first power FET;
   a first comparator that generates a first shutdown signal based on the sense voltage and the first reference voltage;
   a second comparator that generates a second shutdown signal based on the output voltage and the second reference voltage;
   a disable switch that generates a current limit signal in response to receiving a shutdown signal;
   a first timing circuit that sends the first shutdown signal to the disable switch in response to a first user-selectable time elapsing;
   a second timing circuit that sends the second shutdown signal to the disable switch in response to a second user-selectable time elapsing; and
   a shutdown FET that selectively sets the control voltage to a ground reference based on the first or second shutdown signal.

10. An apparatus comprising:
    an input terminal;
    an output terminal;
    an output circuit that is coupled to the input terminal so as to receive an input voltage and that is coupled to the output terminal, wherein the output circuit generates an output voltage based at least in part on the input voltage, and wherein the output circuit has a programmable resistance;
    a reference generator that is coupled to the input terminal and that generates a reference voltage;
    a sense voltage generator that is coupled to the input terminal and the output terminal, wherein the sense voltage generator generates a sense voltage that corresponds to at least a portion of a current flowing through the output circuit;
    a current limiter that is coupled to the reference generator, the sense voltage generator, and the output circuit generator so as to receive the reference voltage and sense voltage and to provide the control voltage to the sense voltage generator and the output circuit.

11. The apparatus of claim 10, wherein the sense voltage generator further comprises:
    a sense resistor that is coupled to the input terminal and current limiter; and
    a sense FET that is coupled to the sense resistor at its drain, the output terminal at its source, and the current limiter at its gate.

12. The apparatus of claim 11, wherein the current limiter further comprises:
    an amplifier that is coupled to the sense resistor so as to receive the sense voltage, that is coupled to the reference generator so as to receive the reference voltage, and that generates the control voltage; and
    a digital current limiter that is coupled to the amplifier, the reference generator, and the output terminal.

13. The apparatus of claim 12, wherein the reference generator further comprises a first reference generator, wherein the reference voltage further comprises a first reference voltage, and wherein the apparatus further comprises a second reference generator that is coupled to the digital current limiter so as to receive a second reference.

14. The apparatus of claim 13, wherein the sense FET further comprises a first sense FET, and wherein the second reference generator further comprises:
    a second sense FET that is coupled to the input terminal at its drain, the digital current limiter at its source, and the amplifier at its gate; and
    a current source that is coupled to the source of the second sense FET.

15. The apparatus of claim 14, wherein the apparatus further comprise a shutdown FET that is coupled to the input terminal at its drain and ground at its source, and wherein the digital current limiter further comprises:
- a first comparator that is coupled to the sense voltage generator and the first reference generator;
- a first timing circuit that is coupled to the first comparator, wherein the first timing circuit issues a first shutdown signal when the sense voltage is less than the first reference voltage for a first predetermined period;
- a second comparator that is coupled to the output terminal and the second reference voltage;
- a second timing circuit that is coupled to the second comparator, wherein the second timing circuit issues a second shutdown signal when the output voltage is less than the second reference voltage for a second predetermined period; and
- a state machine that is coupled to the first timing circuit, the second timing circuit, and the gate of the shutdown FET, wherein the state machine activates the shutdown FET when the state machine receives at least one of the first and second shutdown signals.

16. The apparatus of claim 15, wherein the output circuit further comprises:
- a first power FET that is coupled to the input terminal at its drain, the output terminal at its source, and the amplifier at its gate; and
- a plurality of selectable branches, wherein each branch includes:
    - a second power FET that is coupled to the input terminal at its drain and the output terminal at its source; and
    - a switch that is coupled between the amplifier and the gate of the second power FET.

* * * * *